United States Patent [19]

Blomenkamp

[11] 4,019,147
[45] Apr. 19, 1977

[54] BAND PASS FILTER FOR IMPULSE OPERATION
[75] Inventor: Robert W. Blomenkamp, Palo Alto, Calif.
[73] Assignee: Physics International Company, San Leandro, Calif.
[22] Filed: Dec. 1, 1975
[21] Appl. No.: 636,447
[52] U.S. Cl. .............................. 328/167; 179/1 D; 179/84 VF; 328/112; 328/140; 328/150; 307/234; 333/70 R; 307/362
[51] Int. Cl.[2] ..................... H04M 1/00; H03H 7/14
[58] Field of Search ......... 328/150, 167, 138, 140, 328/111, 112, 113; 179/1 D, 18 HB, 84 VF; 307/210, 234, 237, 235 T; 333/70 R

[56] References Cited
UNITED STATES PATENTS

| | | | |
|---|---|---|---|
| 3,128,349 | 4/1964 | Boesch et al. | 179/84 VF |
| 3,593,275 | 7/1971 | Pumpe | 179/84 VF |
| 3,747,025 | 7/1973 | Iten | 328/167 X |
| 3,836,727 | 9/1974 | Hillekens | 179/84 VF |
| 3,857,104 | 12/1974 | Sacks | 328/167 |
| 3,875,347 | 4/1975 | Alaily | 179/84 VF |

*Primary Examiner*—John S. Heyman
*Attorney, Agent, or Firm*—Robert R. Tipton

[57] ABSTRACT

An electronic band pass filter adapted for passing an oscillating wave pulse of a predetermined band width frequency is provided with a circuit for short circuiting the energy contained in the ring-down at the end of the pulse to ground with additional circuitry for cutting off ring up at the beginning of the pulse and further narrowing the band width frequency.

12 Claims, 12 Drawing Figures

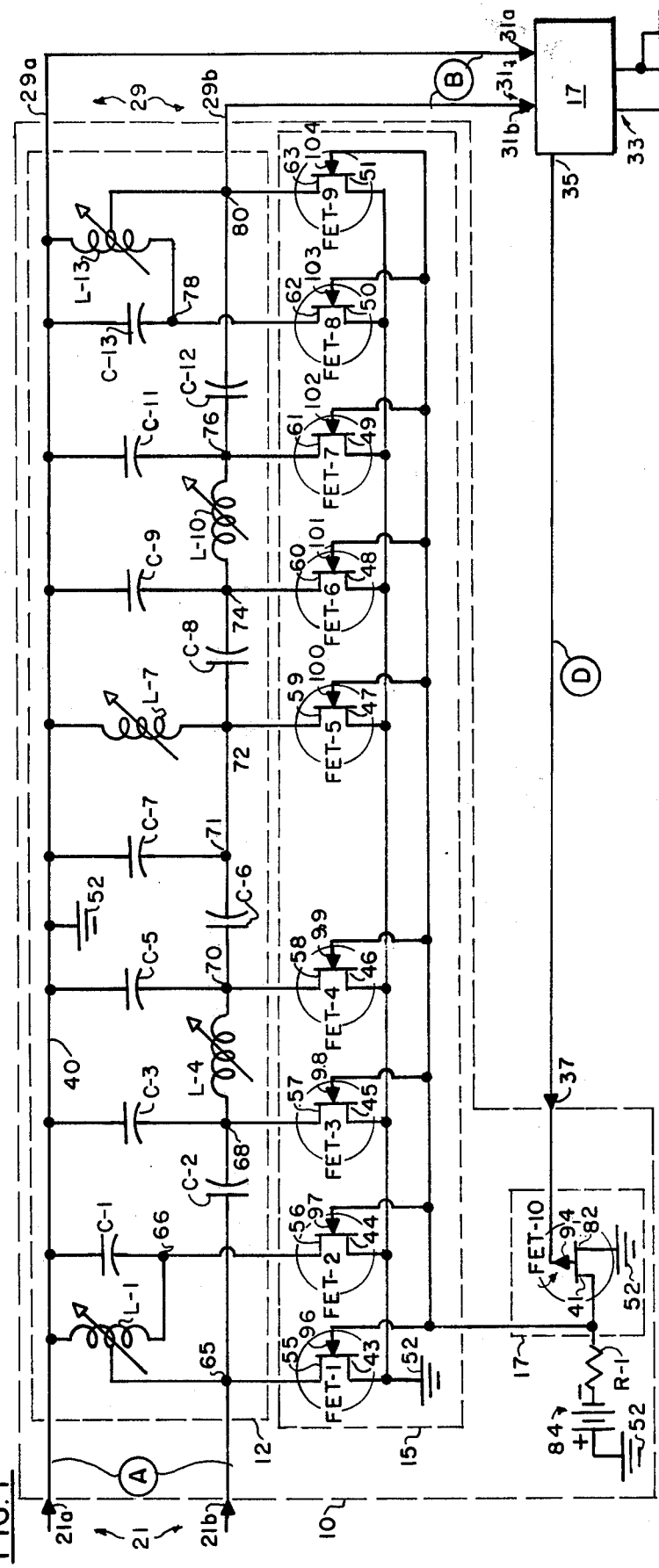

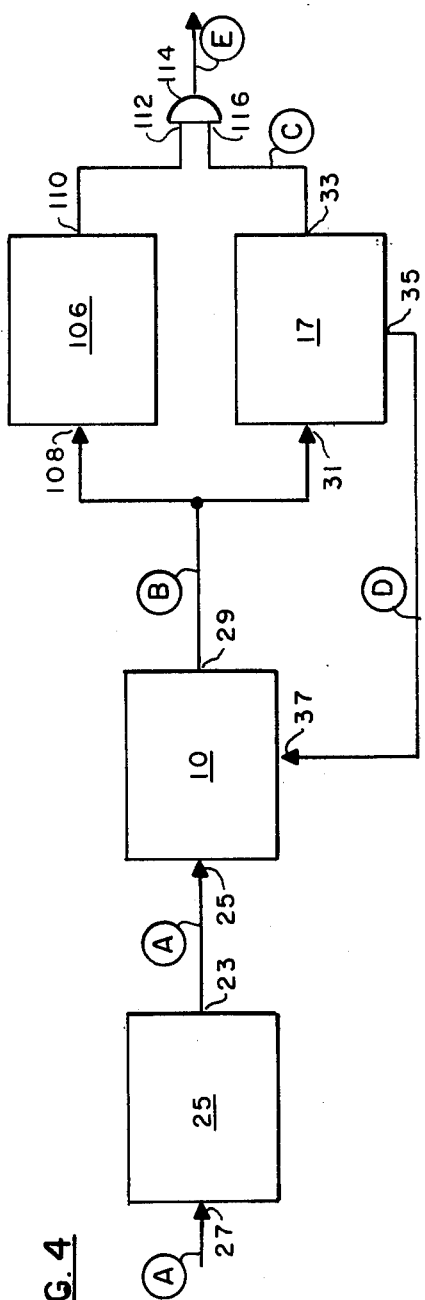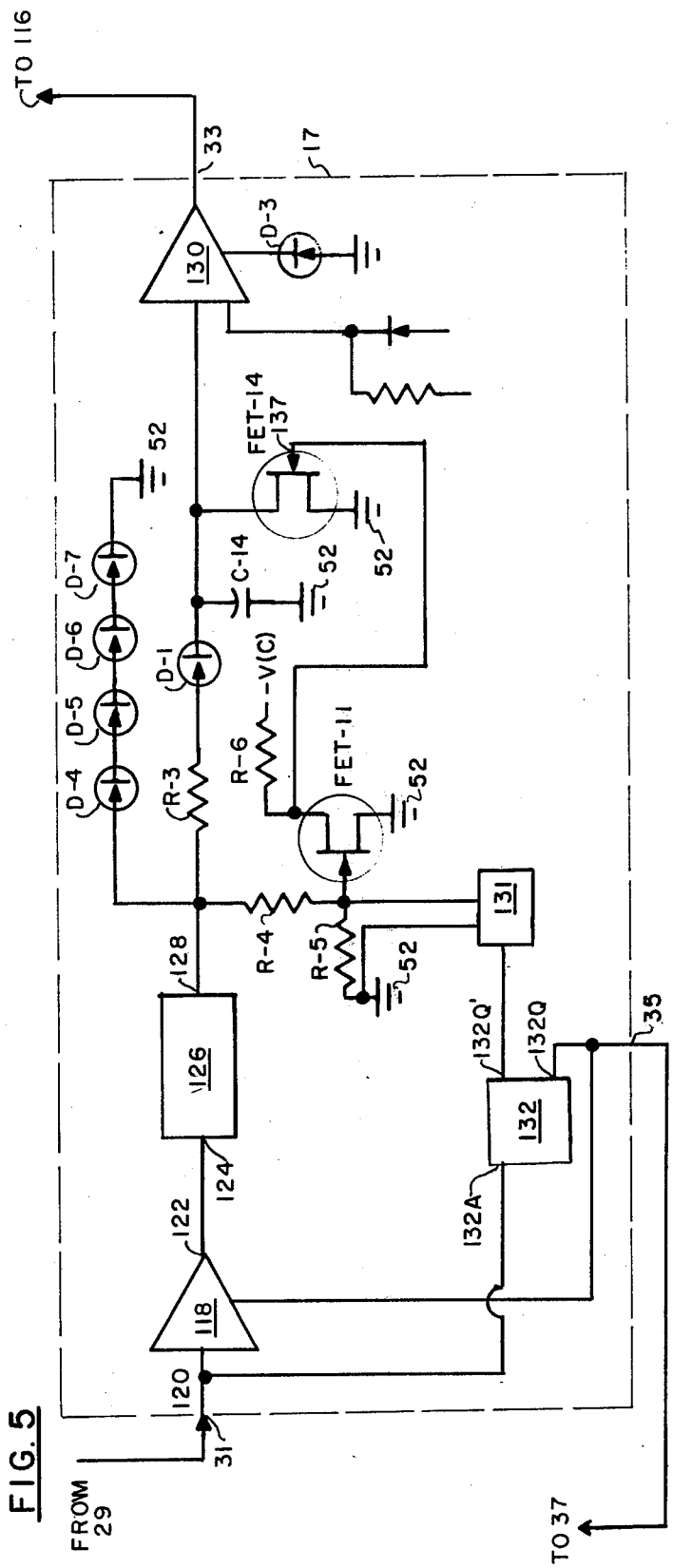
FIG.4
FIG.5

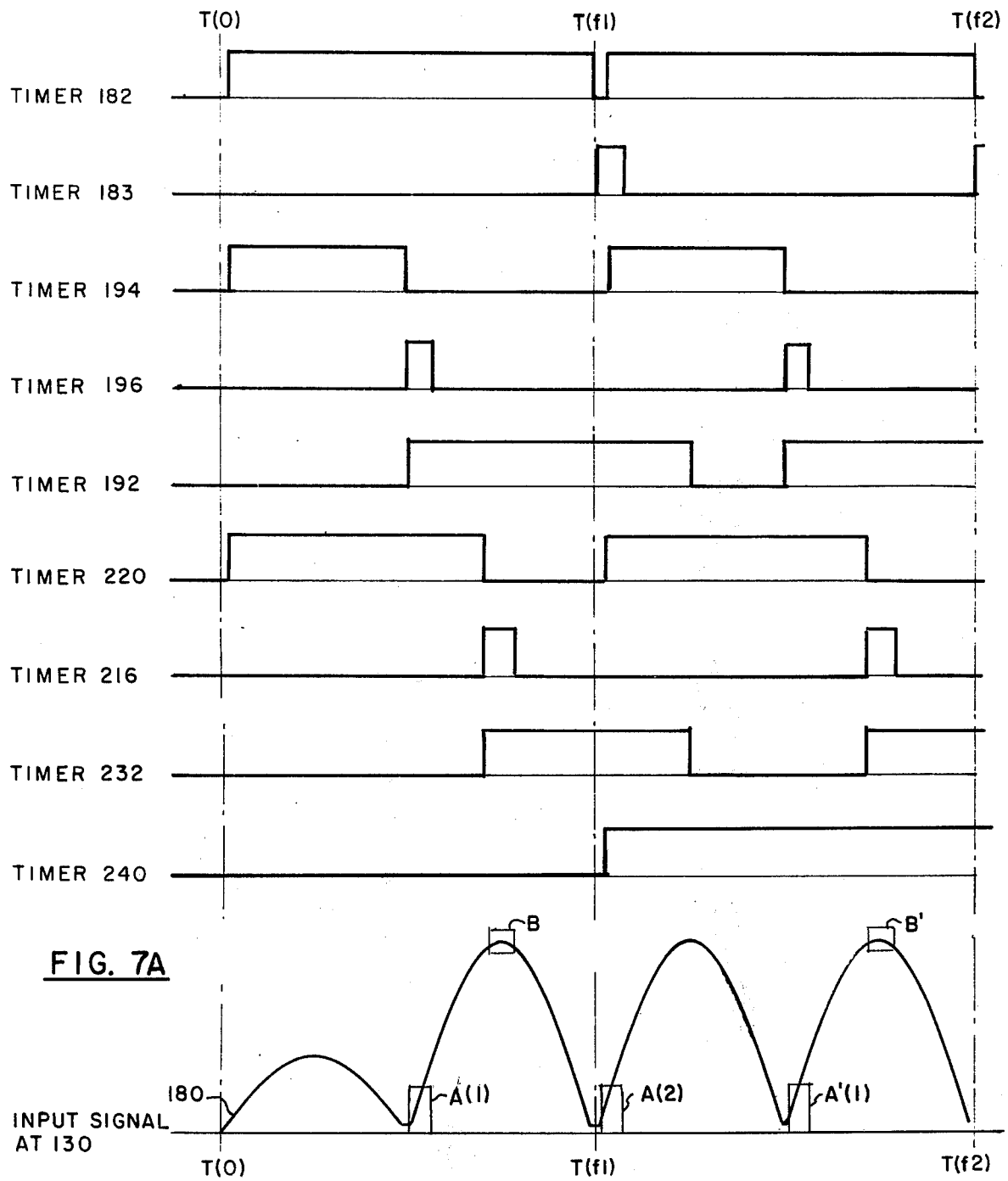

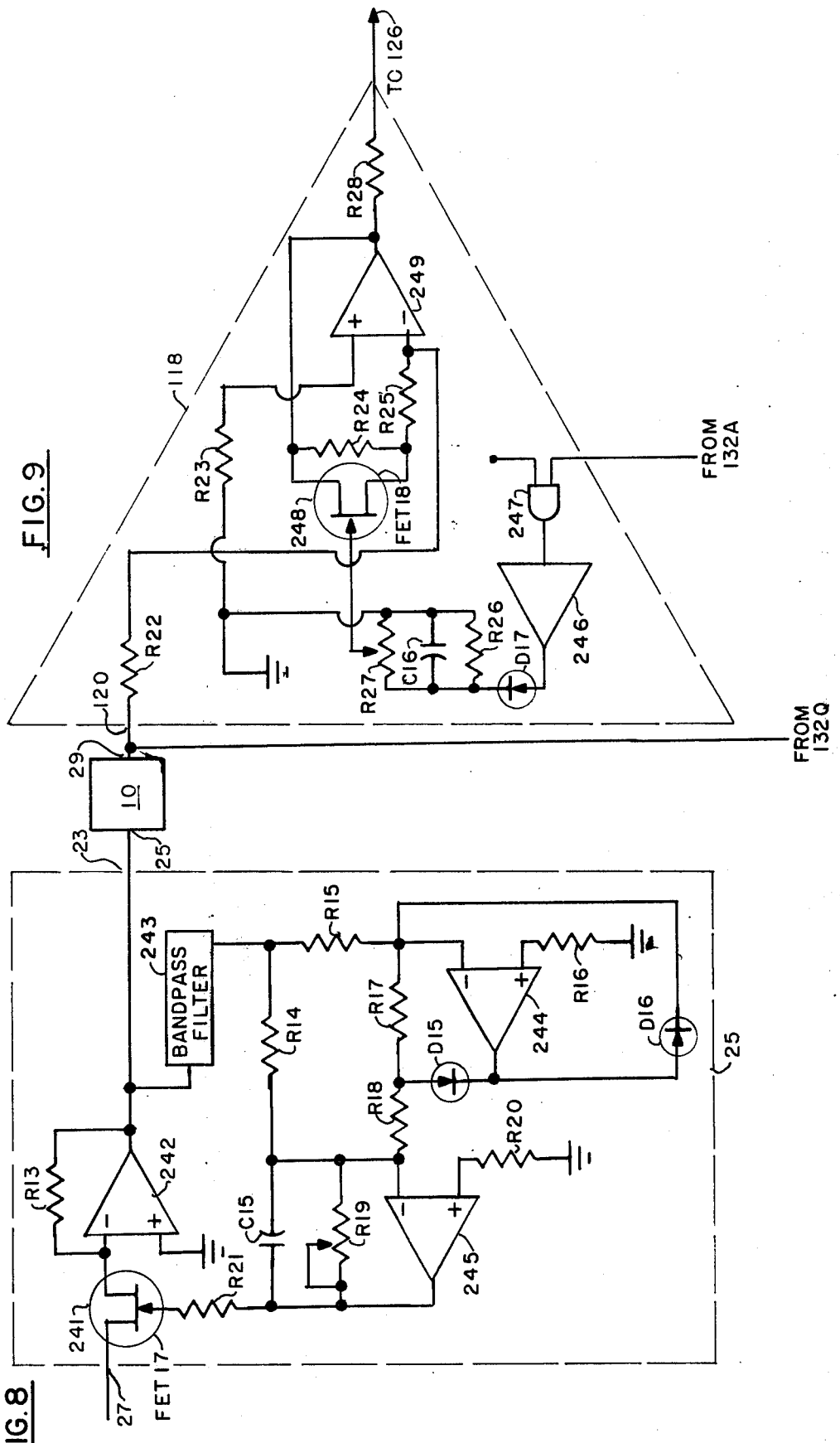

4,019,147

BAND PASS FILTER FOR IMPULSE OPERATION

BACKGROUND OF THE INVENTION

This invention relates generally to electronic filters and particular to band pass filters for correcting distortion in input signals.

Band pass filters of the prior art were concerned primarily with distinguishing oscillating current signals according to their frequency but generally without a need to determine the exact end or beginning of a particular oscillating wave pulse. Where the envelope of an oscillating wave pulse may, at the beginning of its transmission, define a square wave, however, as it travels through a communication system having various inductances, capacitances and resistances distributed throughout the system, it generally is not square at the receiving end. The pulse envelope of the signal at the receiving end of the system becomes quite distorted such that the pulse envelope at the leading end of the pulse slopes upward and downward from the neutral voltage line to define sigmoid curves representing a ring-up, which meet with a similarly formed sigmoid curves at the end of the pulse which narrow down to the neutral voltage line to define a ring-down.

Where the individual oscillating current pulses are transmitted very rapidly, the ring-down portion of one pulse may be superimposed on the ring-up portion of the following pulse. The problem therefore, is one of distinguishing between individual pulses and the measurement of each individual pulse length.

SUMMARY OF THE INVENTION

The filter circuit of the present invention comprises a network circuit of capacitors and inductances adapted to pass a particular frequency of a predetermined band width, with a means for detecting decreases in the amplitude envelope of the oscillating wave pulse, which means then short circuits the energy contained in the network to dissipate the energy contained in the ring-down portion of the pulse with a further circuit is provided for detecting increases in the amplitude envelope of the oscillating wave such that the ring-up of the incoming pulse is clipped and the pulse allowed to pass out of the filter only upon reaching a predetermined amplitude.

It is therefore, an object of the present invention to provide a band pass filter for impulse operation.

It is a further object of the present invention to provide a band pass filter for detecting pulse length.

It is another object of the present invention to provide a band pass filter in which the energy of unwanted portions of the input signal are short circuited to ground.

It is still another object of the present invention to provide a band pass filter for impulse operation in which band width frequency is determined by digital techniques.

These and other objects of the present invention will be manifest upon study of the following detail description when taken together with the drawings.

BRIEF DESCRIPTION OF THE DRAWINGS

FIG. 1 is a circuit diagram of the band pass filter of the present invention showing the circuit for dissipating ring-down energy.

FIG. 2 is a series of curves showing voltage and current pulses of the signal at various points in the circuit.

FIG. 3 is a block diagram of the band pass filter of the present invention for eliminating ring-down showing the relationship between the various circuit elements.

FIG. 4 is a block diagram of the band pass filter circuit of the present invention showing the relationship of the various circuits for eliminating ring-down and ring-up.

FIG. 5 is a circuit diagram for the demodulator of FIG. 4.

FIG. 7 is a time sequence diagram for certain circuit elements of FIG. 6.

FIG. 7A is a curve showing the input signal at amplifier 130.

FIG. 8 is a circuit diagram of the gain control circuit 25 of FIGS. 3 and 4.

FIG. 9 is a circuit diagram of the proportional gain amplifier 118 of FIG. 5.

DESCRIPTION OF THE PREFERRED EMBODIMENT

Figure 6:
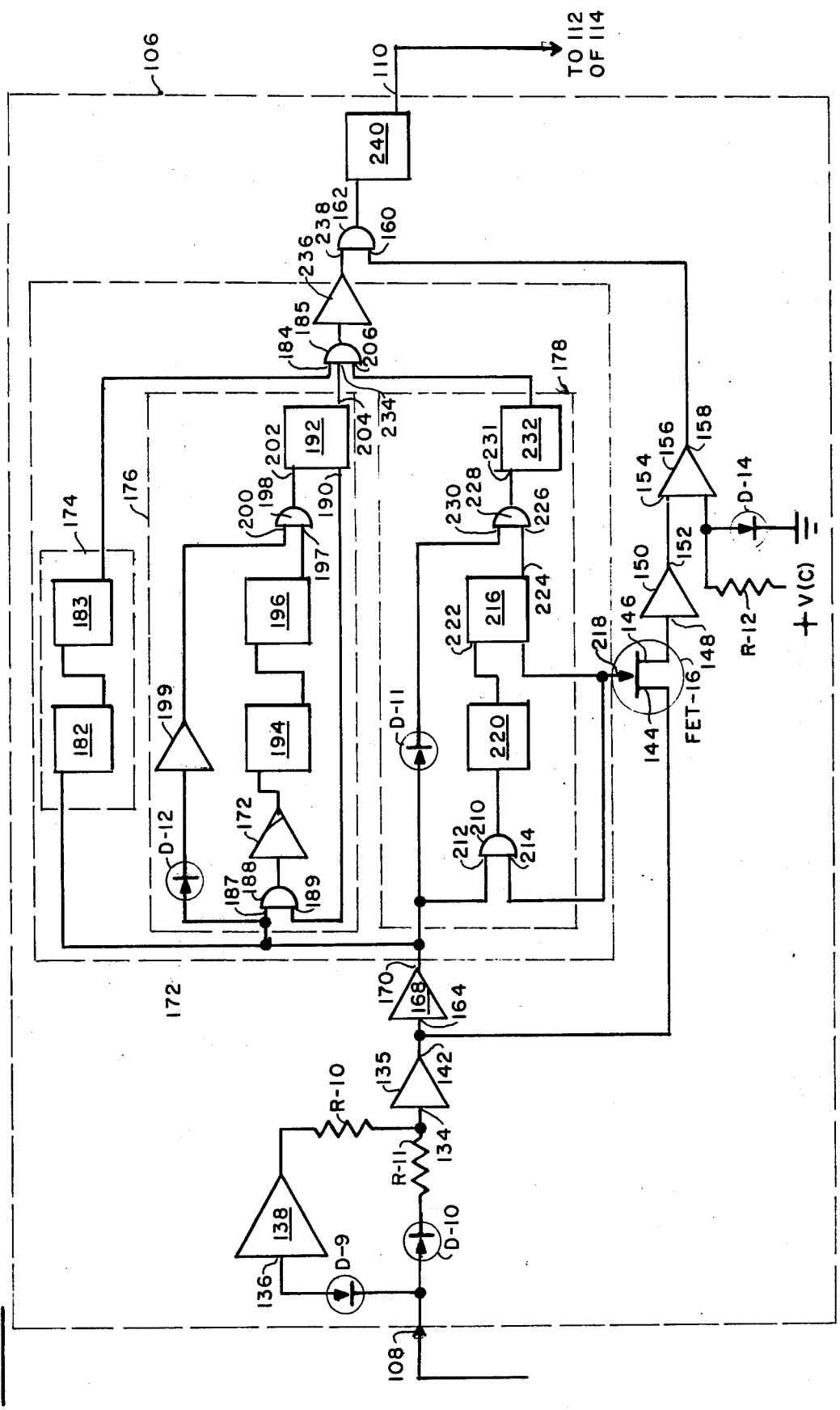
FIG. 6 is a circuit diagram for the active filter portion of FIG. 4.

With reference to FIG. 1 there is illustrated the circuit diagram for band pass filter 10 comprising a band pass network 12 which is connected to a cut off circuit 15 which in turn is connected to voltage detector 17, which is then connected to demodulator 19. This is shown again in FIG. 3 which shows band pass filter 10 having its input 21 connected to output 23 of gain control 25 whose input 27 is connected to the communication system (not shown) and adapted to receive the input pulse signal.

Output 29 of band pass filter 10 is connected to input 31 of demodulator 17 whose output 33 is connected to the various receiving equipment common in the art (not shown) which converts the demodulator signal into a usable form.

Control terminal 35 of demodulator 17 is shown in FIG. 3 as connected to the control input terminal 37 of filter 10 which is as shown in FIG. 1, connected to voltage detector 17.

With reference to FIG. 1 again, band pass network 12 comprises, basically, a common ground side 40 which connects one side of input terminals 21 (21a) and output terminal 29 (29a) directly to each other with a first plurality of series connected inductances and capacitances namely, C-2, L-4, C-6, C-8, L-10, and C-12, which connect the other side of input terminals 21 (21b) to the other side of output terminal 29 (29b). A second plurality of inductances and capacitances, namely, L-1, C-1, C-3, C-5, C-7, L-7, C-9, C-11, C-13, and L-13, are connected in parallel between each of the circuit elements connected in series between terminals 21 (21a, 21b) and 29 (29a, 29b).

Typically network circuit 12 is designed to operate in the frequency range between 300Hz and about 4000Hz. Typical values for the circuit elements for seven different filters is detailed in table 1. The distribution of center frequencys throughout the frequency spectrum is typical for a voice grade telephone system.

TABLE 1

| FILTER | | A | B | C | D | E | F | G |
|---|---|---|---|---|---|---|---|---|
| Ctr | Freq | 325Hz | 445Hz | 1525Hz | 1645Hz | 1765Hz | 2965Hz | 3085Hz |
| L-1, | L-13 | 40.68 | 21.70 | 1.847 | 1.588 | 1.379 | .489 | .451 |
| C-1, | C-13 | 4.778 | 5.170 | 5.761 | 5.725 | 5.786 | 5.843 | 5.846 |
| C-2, | C-12 | 1.568 | .957 | .1546 | .1376 | .1249 | .0543 | .0537 |
| C-3, | C-11 | 3.874 | 2.844 | 1.0100 | .9347 | .8800 | .540 | .500 |
| L-4, | L-10 | 88.00 | 67.3 | 18.7 | 17.40 | 16.20 | 9.65 | 9.27 |
| C-5, | C-9 | 4.340 | 3.124 | 1.116 | 1.034 | .967 | .585 | .562 |
| C-6, | C-8 | 1.110 | .677 | .0487 | .0422 | .0363 | .0128 | .0119 |
| L-7 | | 40.68 | 21.70 | 9.3 | 8.7 | 8.10 | 4.80 | 4.60 |
| C-7 | | | 4.127 | 4.782 | 1.078 | .997 | .9370 | .575 | .555 |

Where:
Capacitance = Microfarads
Inductance = Millihenries

Cut-off circuit 15 comprises basically a plurality of field effect transistors, FET-1 through FET-9, having their gates, 96, 97, 98, 99, 100, 101, 102, 103 and 104, respectively, connected to gain 41 of field effect transistor 10 of voltage detector 17.

Sources 43 through 51 of field effect transistors FET-1 through 9, respectively, are all connected in common to ground 52 while drains 55 through 63, respectively, of field effect transistors FET 1 through 9, inclusive, are connected generally between the series connected circuits elements of circuit 12 which are connected between input terminal 21b and output terminal 29b. In particular, drain 55 is connected to the ungrounded side of input terminals 21 near terminal 21b, at point 65 which is also connected to the center tap of inductance L-1. Drain 56 of field effect transistor FET-2 is connected to the point of common connection 66 of the ungrounded side of inductance L-1 and capacitance C-1. Drain 57 of field effect transistor FET-3 is connected, at point 68, between capacitor C-2 and inductance L-4. Drain 58 of field effect transistor FET-4 is connected at point 70 between inductance L-4 and capacitor C-6. Drain 59 of field effect transistor FET-5 is connected, at point 72, between capacitors C-6, C-7 and L-7 and C-8. Drain 60 of field effect transistor FET-6 is connected, at point 74, between capacitors C-8 and C-9 and inductance L-10. Drain 61 of field effect transistor FET-7 is connected, at point 76, between inductance L-10 and capacitor C-11 and capacitor C-12. Drain 62 of field effect transistor FET-8 is connected, at point 78, the common connection, to the ungrounded side of capacitor C-12 and inductance L-13. Drain 63 of field effect transistor FET-9 is connected to the ungrounded side of output terminals 29 near terminal 29b at point 80 which is also connected to the center tab of inductance L-13.

It should also be noted that source 82 of field effect transistor FET-10 is also connected to ground 52 while drain 41, besides being connected to the gates of field effect transistors FET-1 through FET-9, is also connected to the negative side of direct current power source 84 through resistor R-1, with the positive side of power source 84 connected to ground 52, thus completing the circuit.

With reference to FIG. 2, there is illustrated a group of curves representing the wave of the oscillating current signal at various points throughout the circuit of FIGS. 1, 3 and 4. With reference to curve A, there is shown the typical incoming pulse signal 86 between time T(0) to T(3), the time period which corresponds with the pulse length of the original signal. The shape of input pulse signal 86 is defined by pulse signal envelope 88 indicated by the dashed line which traces the peak amplitude of each cycle of the input pulse signal current (or voltage). It will be noted that at about time T(0), envelope 88 curves up and down from the zero or neutral voltage line 90 in a sigmoid curve to define a ring-up portion from time T(0) to T(1) and then continues to about time T(2) where it curves toward the zero or neutral voltage line 99 in a sigmoid curve to define the ring-down portion of pulse 86 from time T(2) to T(3).

Curve B illustrates output pulse signal 92 after it has passed through filter 10 in which envelope 94 now defines the shape of the oscillating current pulse to include the ring-up sigmoid portion from time T(0) to T(1), however, the ring-down portion at time T(2) to T(3) has been eliminated through the grounding of circuit 12 at time T(2).

It should be noted that the ring-up time is mainly a function of the bandwidth characteristic of the transmission line. The ring-down characteristic at the completion of the tone burst is generally determined by the inductance and capacitance of the transmission line since it acts like a filter. Besides this, there is an amplitude variation across the frequency spectrum of the voice grade telephone line which is the reason for the use of gain control 25. These amplitude variations are overcome by the use of the automatic gain control amplifier, whose circuit diagram is shown in FIG. 8, which is the function of gain control 25.

The problem of ring-up and ring-down occurs not only in the transmission line but also in the narrow band pass filter 12 used to separate the individual channel frequencies from the composite frequency being transmitted over the telephone lines. Therefore, curve A of FIG. 2 would be further exaggerated as it passes through network 12 if circuit 15 were not operative.

Circuit 10 operates on the basis of the measurement, by the demodulator 17, of the decrease in amplitude envelope 88 at the trailing end of pulse 86 as it leaves the output terminals 29 of circuit 12. At a predetermined point of decrease in the amplitude of pulse envelope 88, a signal is transmitted from demodulator 17 to gate 94 of field effect transistor FET-10 causing drain 41 of that transistor to switch to a negative value which is applied to gates 96 through 104, respectively, of field effect transistors FET-1 through 9, inclusive, which transistors remain in the grounded position causing the energy distributed throughout circuit 12 to be short circuited to ground 52, after which the signal on gate 94 of field effect transistor FET-10 is removed, returning circuit 12 to its operating condition for receipt of the next incoming pulse. The effect of the short circuiting of circuit 12 is illustrated in curve B of FIG. 2 by the abrupt termination of envelope 94 at time T(2).

It has been found that the amount of time required for the cutoff period is approximately 1½ cycles. In some cases, that is, for frequencies between 800 and 1600 Hz, cut-off can occur at approximated three-quarters of one cycle.

To eliminate the ring-up distortion at time T(0) to T(1), reference is made to FIG. 4 where there is illustrated a block diagram similar to that of FIG. 3, however, with a ring-up filter or ring-up eliminator 106 connected in parallel with demodulator 17 and with its input terminals 108 connected to output terminals 29 of filter 10. The output terminals 110 of filter 106 are connected to input side 112 of gate 114 with output terminals 33 of demodulator 17 connected to the other input side 116 of gate 114.

The circuit diagram for demodulator 17 is shown in greater detail in FIG. 5 and comprises, basically, a proportional gain amplifier 118 having its input side 120 connected to the input terminal 31 of demodulator 17 and with its output 122 connected to input 124 of rectifier and first filter 126. Rectifier and first filter 126 comprises a circuit, common in the art, for the purpose of rectifying and initially filtering the input signal.

Output 128 of rectifier and first filter 126 is connected, along one path, through resistor R-3, diode D-1 and amplifier 130 to output terminal 33.

Output terminals 128 of rectifier and first filter 126 are also connected, by another path, through resistor R-3, diode D-1, field effect transistor FET-14, buffer 131 and timer 132 to control terminal 35.

Output terminals 128 of rectifier and first filter 126 are also connected to ground 52 by way of several paths, one path being through diodes D-4, D-5, D-6 and D-7, another path being through resistor R-4 and field effect transistor FET-11 and a third path being through resistor R-4 and resistor R-5.

Within circuit 17 a multivibrator timer 132 is provided whose output side 132Q is connected to amplifier 118 and whose output side 132Q' is connected through buffer circuit 131 to gate 137 of FET 14. The input side 132a of timer 132 is connected to the input side 120 of amplifier 118. The signal from timer 132 through output side 132Q controls a programable gain change within amplifier 118 so that the gain is increased during time T(0) to T(1) to inversely match the ring-up characteristics of the filter which signal then remains at a fixed lower level after time T(1). This programable gain is set for each different frequency channel. It will also be noted that output side 132Q is also connected to output 35 of circuit 17 which is also connected to input side 37 of band pass filter 10 (FIGS. 1, 3 and 4).

With reference to FIG. 8, there is illustrated a detailed circuit diagram of gain control 25. Gain control by gain control 25 is accomplished with the changing impedance of FET 17 and fixed feedback resistor R13 deriving the gain of amplifier 242. The wave shape as illustrated in FIG. 2, curve A, is also representative of all the composite frequencies which are applied to input 27. They include, also, the constant supervisory tone or frequency which is used for controlling the gain of circuit 25. The supervisory tone or frequency passing through amplifier 242, resistor R13 and FET 17, passes through band pass filter 243. This band pass filter is of the same construction as the passive portion of FIG. 1 without the FET ringdown eliminator switches. This constant supervisory tone passes through band pass filter 243 and is rectified in the rectifier made from amplifier 244, diodes D15 and D16 and associated resistors R16, R15, R14 and R17. Thus, at source resistor R18 of DC amplifier 245, the DC signal, consisting of a rectified AC pulse, is fed into the low-pass filter comprising amplifier 245, resistors R20, R18 and R19, and capacitor C15. The feedback resistor, R19 in this low pass filter, determines the gain and is adjustable. The output of the lowpass filter is essentially a DC voltage analogous of the amplitude of the supervisory tone as detected in band pass filter 243. This DC analogous voltage is sent to the gate on FET 17 17 where it determines the impedance of the FET 17 and hence determines the gain of amplifier 242. Thus the output 23 of the composite frequencies of all signals is controlled by the amplitude of the supervisory signal passing through band pass filter 243 and is constantly correcting for the attenuation characteristics of the telephone line.

With reference to FIG. 9, there is illustrated a more detailed circuit diagram for the proportional gain amplifier 118 of demodulator circuit 17.

Output 132A from timer 132 in demodulator circuit 17, is the enabling gate that allows the proportional gain amplifier 118 to provide an output which is the complimentary form to the rise time characteristics of curve B of FIG. 2. Circuit 118 comprises an amplifier 249 whose feed back resistance or impedance comprises resistor R225 and the impedance value of FET 18 in parallel with resistor R24. This feedback resistor value in conjunction with the source resistor R22 for amplifier 249 will determine the gain relationship of that amplifier. When the gated signal from circuit 132 reaches AND-gate 247, it then activates voltage comparator 246 through diode D17 and provides an activating voltage to the parallel RC time constant circuit network of R26, R27 and C16. The output of this RC network will provide a varying voltage to the gate of FET 18. The impedance between the source and drain of FET 18 will be analogous to the output voltage, with respect to time, of the charging RC time constant voltage. Thus giving analogous impedance change of the FET 18 source drain output. Therefore, the output of the proportional gain amplifier will have a fixed gain at the end of the time constant derived by R22, R27 and C6. Proper choice of the parameters could make the tenuation characteristics of the maximum gain to the fixed gain the inverse curve of the ring-up value as shown in FIG. 2, curve B.

Figures 10, 11:
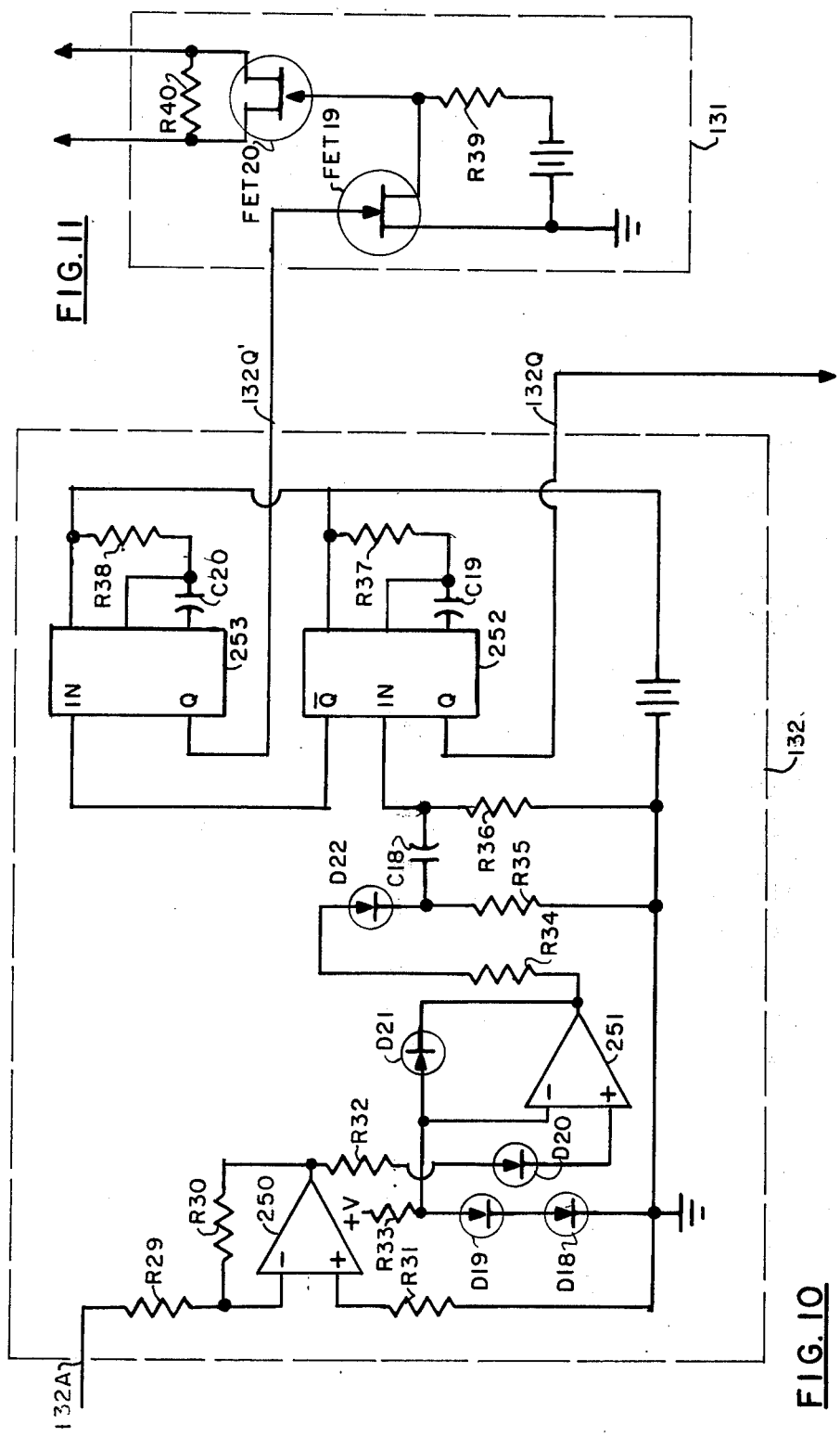
FIG. 10 is a circuit diagram of timer 132 of FIG. 5.
FIG. 11 is a circuit diagram of buffer circuit 131 of FIG. 5.

With reference to FIGS. 10 and 11, there is illustrated a more detailed circuit diagram of timer 132 and buffer 131, respectively, of demodulator circuit 117.

With receipt of the incoming oscillating wave at input 132A into FIG. 10 of timer 132, the oscillating wave is introduced into amplifier 250. This amplifier is a normal, high gain, AC amplifier comprising operational amplifier 250 and resistance R29, R30 and R31. The gain of this amplifier is relatively high and thus it produces a sinusoidal output at the first cycle of the input signal. Comparator 251 has a reference voltage noise isolation of 2 diode junctions D19 and D18 as applied to the inverting side of comparator 251. When no signal is being received into the non-inverting side of comparator 251, then the feed back loop is unity as provided by diode D21, causing the output of comparator 251 to be unity gain with the noise isolation voltage from diodes D19 and D18. When a signal is received through source resistor R23 and diode isolator D20 into the non-inverting input, and that input exceeds the comparator reference level of 1.4 volts from diodes D19 and D18, the comparator then switches state and goes to positive supply voltage. Comparator 251 therefore acts as an open loop amplifier since feed back diode D21 is back biased. The positive going pulse then is sent to diode D22 and then differentiated in a differentiator made from capacitor C18 and resistors R35 and R36. This differentiator provides a positive going gate to start timer 252. The time constant of timer 252 is derived from capacitor C19 and resistor R37. The Q output of this timer feeds signal 132Q to proportional amplifier 118.

The Q-bar output of timer 252 is trigger to the input gate of timer 253 whose time constant is established by capacitor C20 and resistor R38. The Q output of timer 253 goes positive after a delay established by timer 252 from the input signal sinusoid on line 132A, thus allowing for the time-off period as shown in FIG. 2 of less than one cycle.

The output of timer 132 goes to buffer 131. Upon receipt of the signal into buffer 131, from timer 132 through lead 132Q', line FET 19 is switched from its normal conducting state to a non-conductive state, hence, with the rising values of voltage on line 132Q', the gate FET goes from roughly 0 voltage to a negative voltage, thus removing the short across R40 and removing FET 20 from its conducting state. Hence, resistor R40 is no longer shunted by the R(Ds) value of FET 20.

With reference to FIG. 6 there is illustrated a detailed circuit diagram for ring-up filter or ring-up eliminator 106 which circuit comprises, beginning at input terminal 108 a diode D-10 which is connected to a resistor R-11 which, in turn, is connected to input 134 of amplifier 135. Also connected at terminal 108 in parallel with diode D-10 and resistor R-11 is diode D-9 which is connected to input 136 of amplifier 138 whose output 140 which is connected through resistor R-10 to the input side 134 of amplifier 135. From output 142 of amplifier 135, the circuit branches in two legs, one leg connects the output 142 of amplifier 135 with source 144 of field effect transistor FET-16. The drain 146 of field effect transistor FET-16 is then connected to input side 148 of amplifier 150. Output side 152 of amplifier 150 is then connected to one input side 154 of amplifier 156. The output side 158 of amplifier 156 is connected to one input side 160 of AND-gate 162.

The other leg of the circuit from output 142 of amplifier 135 is connected to the input side 164 of amplifier 168.

Output side 170 of amplifier 168 is connected to frequency and amplitude window circuit 172 which creates the time and amplitude windows through which the incoming signal pulse is detected and is either passed through the circuit or rejected as not satisfying the predetermined frequency and amplitude requirements of the input signal.

Circuit 172 comprises, basically, a pulse period timing circuit 174, a frequency timing circuit 176 and a frequency-amplitude timing circuit 178. The timing sequence for each of the circuits is graphically illustrated in FIG. 7 as applied to rectified sign wave 180 coming from filter 10.

Circuit 174 comprises basically, timer 182 connected in series with timer 183 whose input is connected to output 170 of amplifier 168 and whose output is connected to one input side 184 of gate 185.

The timing sequence for timers 182 and 183 are shown in FIG. 7 for the period T(0)–T(f) and T(f1)–T(f2).

Timing circuit 176 comprises basically, an OR-gate 188 having one side 187 connected to the output terminal 170 of amplifier 168 and whose other input terminal 189 is connected to output side 190 of timer 192. The output side of OR-gate 188 is connected to the input side of amplifier 192 whose output side is connected to the input side of timer 194 in turn whose output side is connected to the input side 197 of timer 196 and whose output is then connected to one input side of gate 198. Also connected to input side 187 of OR-gate 188 is diode D-12 which is connected in turn to the input side of amplifier 199 whose output is connected to the other input side 200 of gate 198. The output of gate 198 is then connected to the input side 202 of timer 192. The other output side 204 of timer 192 is then connected to one input side 234 of gate 185.

Timing circuit 178 comprises an OR-gate 210 whose one input side 212 is connected to the output 170 of amplifier 168 and whose other input side 214 is connected both to timer 216 and gate 218 of field effect transistor FET-16.

The output side of OR-gate 210 is connected to the input side of timer 220 whose output is connected to one input side 222 of timer 216. Output side 224 of timer 216 is connected to one input side 226 of gate 228. The other input side 230 of OR-gate 228 is connected back to diode D-11 which in turn is connected back to output side 170 of amplifier 168. The output of OR-gate 228 is connected to the input 231 side of timer 232 whose output is then connected to input side 234 of gate 185.

The output side of gate 185 is then connected in series to the input side of amplifier 236 whose output is connected to one input side 238 of AND-gate 162. The output side of AND-gate 162 is in turn connected to timer 240 whose output 110 is connected to input side 112 of gate 114 (FIG. 4).

It is the function of the combination of diodes D-9 and D-10, resistors R11 and R10, and amplifiers 138 and 135 along with amplifier 168 to take the incoming oscillating pulse from circuit 10 (curve B of FIG. 2) and rectify it as a full wave rectified signal 180 as shown in FIG. 7A.

FIG. 7 illustrates the timing pulses for each of the timers shown in FIG. 6 and is drawn in the same time relationship to FIG. 7A to illustrate the method of forming the time and amplitude windows.

The circuit of FIG. 6 is designed to form three time amplitude windows as shown in FIG. 7A, namely, time window A(1), time window A(2) and time window B (and time window A'(1) and B' of the next measurement period). Time windows A(1) and A(2) are established for detecting an input signal having a particular frequency at approximately zero or slightly above zero voltage while time window B is established to detect the input signal at both the predetermined frequency and at a fixed amplitude. In relation to FIG. 6 time window A(1) is established by timing circuit 176, time window A(2) is established by timing circuit 174 while time window B is established by timing circuit 178.

At time T(0) an input signal is applied to the input terminals 108 of circuit 106 resulting in signal 180 at output 142 of amplifier 135 and a similar signal at output 170 of amplifier 168.

As the signal voltage rises above zero, or a neutral voltage, this voltage is applied simultaneously to the input side of timer 182 side 200 of AND-gate 198, side 187 of OR-gate 188, side 230 of OR-gate 228 and side 212 of OR-gate 214.

This rise in voltage causes timers 182, 194 and 220 to emit an output pulse as shown in FIG. 7. For timer 182, this pulse extends for your period from shortly after time T(0) to time T(f1). For timer 194 its output pulse extends from shortly after time T(0) to one-half the period between time T(0) and T(f1). Also at the same time, timer 220 is caused to emit a pulse beginning shortly after time T(0) and extending for a period three-quarters of the time from T(0) to T(f1). Thus, timer 182 sets up the beginning edge of time window A(2), while timer 194 sets up the beginning edge of time window A(1) and timer 220 sets up the beginning edge of time window B.

Since the output of timer 182 is connected to the input of timer 183, when the timing pulse of timer 182 decays to zero, timer 183 is caused to emit a pulse as shown in FIG. 7 which determines the time width of window A(2). In a similar manner when the pulse from timer 194 decays to zero and since the output of timer 194 is connected to the input of 196, timer 196 is caused to emit a pulse which determines the width of time window A(1).

Also, in a similar manner, as the pulse from timer 220 decays to zero, since its output is connected to input 222 of timer 216, timer 216 is caused to emit a pulse, as shown in FIG. 7, which determines the width of time window B. It should be noted that the lower voltage limit for time window B is established by diode D-11 while the upper value of voltage is established by the combination of amplifiers 150 and 156. It should also be noted that in circuit 176, when the upper voltage limit for time window A(1) is met and an output pulse appears from timer 196 at input 197 of AND-gate 198, this pulse appears at input 202 of timer 192 causing a pulse to be generated, as shown in FIG. 7, extending for a predetermined time to include the three time windows A(1), B and A(2). In a similar manner when the minimum voltage for time-amplitude window B is reached and a voltage appears at input 230 of OR-gate 228 concurrently with the output pulse from timer 216 at input 226 of OR-gate 228 then a voltage will be caused to appear at input 231 of timer 232 for it to emit the pulse as shown in FIG. 7.

This cycle is then repeated for time T(f1) to time t(f2) as long as the input signal meets the criteria established by time windows A(1), B and A(2).

Therefore, when a voltage appears simultaneously at the inputs 184, 234 and 206 of AND-gate 185, only then will a pulse appear at input 238 of AND-gate 162. Thus, as input signal 180 passes time window A(1) a voltage appears only at input 234 of AND-gate 185 from timer 192. No voltage appears from timer 183 or timer 232. In a similar manner at time window B, just before time T(f1), a voltage will appear at input 208 of AND-gate 214 and input 234 from timer 192 but no voltage will appear from timer 183. However, at time T(f1), as can be seen from FIG. 7, a voltage will appear simultaneously at inputs 184, 234 and 206 of AND-gate 185, respectively, from timers 183, 192 and 232. Thus a voltage is caused to appear at the output side of AND-gate 185 and be amplified by amplifier 234 to provide a voltage at the input side 238 of AND-gate 162, coinciding with the signal from amplifier 156.

Timer 240 is then caused to be activated creating a pulse, as shown in FIG. 7, extending for the maximum period of the input pulse to the system so long as the criteria for the time amplitude windows is being fulfilled. Timer 240 is a retriggerable timer with a basic time period lasting slightly longer than the last sampling period (for example, each time period T(0)–T(f1), T(f1)–T(f2), etc.) Therefore, as soon as the ring-up or leading edge of the input signal meets the criteria of frequency and amplitude a voltage is applied to input side 112 of AND-gate 114 (FIG. 4) and if a voltage is also applied by the signal coming from demodulator 17 to input side 116 of AND-gate 114 then the output signal from AND-gate 114 wil be allowed to pass and will be of the wave shape shown for curve E in FIG. 2.

Thus, circuit 106, which eliminates the ring-up portion of the pulse, in combination with circuit 10 which extinguishes the ring-down characteristics of the input signal, creates a circuit which removes the distortion from an oscillating wave pulse whereby its pulse length can be accurately measured.

I claim:

1. A filter comprising
    means defining a filter circuit for passing an oscillating wave pulse of a predetermined band width frequency, the shape of said pulse being defined by an amplitude envelope, said filter circuit having a pair of input terminals and a pair of output terminals,
    means defining a demodulator connected to said output terminals of said filter circuit for detecting increases in said amplitude envelope of said oscillating wave pulse, and
    means for short circuiting the terminals of said filter circuit upon detection of a predetermined decrease in amplitude of said amplitude envelope at the end of said pulse.

2. The filter circuit as claimed in claim 1 wherein
    said pair of input terminals and pair of output terminals define first and second input and output terminals, respectively,
    said first input terminals being connected to said first output terminals, and comprising
    a first plurality of series connected capacitors and inductors connected between said second input and said second output terminals, and
    a second plurality of parallel connected capacitors and inductors connected between individual capacitors and inductors of said first plurality of series connected capacitors and inductors and said commonly connected first input and output terminals.

3. The filter as claimed in claim 2 wherein said means for short circuiting the terminals of said filter circuit comprises
    means defining a plurality of switches connected between individual capacitors and inductors of said first plurality of capacitors and inductors and said commonly connected first input and first output terminals, and
    means for actuating said switches upon detection of a predetermined decrease in amplitude of said amplitude envelope at the end of said pulse, said means connected to said means for detecting decreases in said amplitude envelope.

4. The filter as claimed in claim 1 wherein said demodulator comprises
    means for amplifying said oscillating wave pulse, means connected to said output of said amplifier for rectifying said oscillating wave pulse, means for detecting a predetermined decrease in amplitude of said oscillating wave pulse, and means for reducing the gain of said amplifier to zero upon detection of said predetermined decrease in amplitude.

5. The filter circuit as claimed in claim 1 further comprising means for detecting a predetermined amplitude and frequency characteristic of said oscillating wave pulse connected to said output terminals of said filter circuit comprising a first AND-gate having first, second and third input sides and an output side, means for connecting said first input side of said first AND-gate to said output terminals of said filter circuit for receiving said oscillating wave pulse, means for creating a first electrical pulse having a predetermined time duration defining a time window and occuring at a predetermined time period after said oscillating wave passes through a neutral voltage to define a frequency characteristic, means for connecting said first electrical pulse means to said second input side of said first AND-gate, means for detecting a voltage amplitude of said oscillating wave pulse between a predetermined maximum and minimum voltage, means for applying said voltage to said third input side of said first AND-gate, means for connecting said output side of said first AND-gate to said means for switching the output signal of said demodulator, and means for switching the output signal of said demodulator "on" upon detection of said signal having said predetermined amplitude and frequency characteristics.

6. The filter circuit as claimed in claim 5 wherein said means for switching the output signal of said demodulator comprises a second AND-gate having first and second input sides and an output side, means for connecting the output side of said first AND-gate to the first input side of said second AND-gate, means for connecting the output side of said demodulator to said second input side of said second AND-gate.

7. The filter circuit as claimed in claim 5 wherein said means for detecting a voltage comprises means for detecting a maximum and minimum voltage and means for creating a signal for all voltages between said maximum and minimum.

8. The filter circuit as claimed in claim 7 wherein said means for detecting a maximum and minimum voltage comprises means for detecting a maximum voltage amplitude and creating a signal voltage for all voltages below said maximum, means for detecting a minimum voltage and creating a signal voltage for all voltages above said minimum, a second AND-gate having first and second input sides and an output side, means for connecting said maximum voltage detector to said first input side of said second AND-gate, and means for connecting said minimum voltage detector to said second input side of said second AND-gate, and means for connecting said output side of said second AND-gate to said third input side of said first AND-gate.

9. A band pass filter comprising an input signal comprising an oscillating wave pulse having a predetermined frequency, a leading end and a trailing end, means defining a demodulator for detecting and converting said oscillating wave input pulse into a direct current output pulse said demodulator having inut and output sides with said input side adapted to receive said input signal, means for creating a time window having a predetermined time duration and created at predetermined time intervals corresponding to the frequency of said oscillating wave, means for creating voltage difference windows at predetermined maximum and minimum voltages, means for switching said output pulse from said demodulator "on" at the leading end of said pulse when said input signal frequency and amplitude characteristics are within said predetermined time window and voltage window ranges, and "off" at the trailing end of said pulse when said input signal and amplitude characteristics do not come within said ranges.

10. The band filter as claimed in claim 9 wherein said means for creating time windows at predetermined time intervals comprises means for detecting when said oscillating wave pulse passes through a neutral voltage, means connected to said means for detecting said voltage for creating a first electrical pulse having a predetermined time duration defining a time window and occuring at a predetermined time period after said oscillating wave passes through said neutral voltage to define a frequency characteristic.

11. The band pass filter as claimed in claim 9 wherein said means for creating voltage difference windows and predetermined maximum and minimum voltages comprises means for detecting a predetermined maximum voltage amplitude and creating a signal voltage for all voltages detected below said maximum voltage, means for detecting a predetermined minimum voltage and creating a signal voltage for all voltages detected above said minimum voltage, a first AND-gate having first and second input sides and an output side, means for connecting said maximum voltage detector to said first input side of said first AND-gate, means for connecting said minimum voltage detector to said second input side of said first AND-gate, and means for connecting said output side of said second AND-gate to said means for switching said output pulse from said demodulator.

12. The band pass filter as claimed in claim 11 wherein said means for switching said output pulse from said demodulator "on" and "off" comprises a second AND-gate having a first, second and third input side and an output side, means for connecting said first input side of said second AND-gate to said input side of said demodulator for receiving said input signal, means for connecting said first electrical pulse creating means to said second input side of said second AND-gate,
means for connecting said third input side of said second AND-gate to the output side of said first AND-gate, a third AND-gate having first and second input sides and an output side,
said first input side of said third AND-gate connected to the output side of said second AND-gate, and
said second input side of said third AND-gate connected to the output side of said demodulator.

* * * * *